(12) United States Patent
Nagao

(10) Patent No.: US 6,320,432 B1
(45) Date of Patent: Nov. 20, 2001

(54) OUTPUT BUFFER CIRCUIT

(75) Inventor: Chuma Nagao, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/670,577

(22) Filed: Sep. 27, 2000

(30) Foreign Application Priority Data

Mar. 30, 2000 (JP) .................................................. 12-095558

(51) Int. Cl.[7] .............................. H03B 1/00; H03K 3/00
(52) U.S. Cl. .............................................. 327/108; 327/112
(58) Field of Search ..................................... 327/108, 111, 327/112, 379, 387, 185; 326/57, 58, 82, 83, 85

(56) References Cited

U.S. PATENT DOCUMENTS

| | | | |
|---|---|---|---|
| 5,218,239 | * | 6/1993 | Boomer ................................. 327/112 |
| 5,430,404 | * | 7/1995 | Campbell et al. .................... 327/566 |
| 6,094,086 | * | 7/2000 | Chow .................................... 327/396 |
| 6,118,303 | * | 9/2000 | Schmitt et al. ......................... 326/83 |
| 6,236,248 | * | 5/2001 | Koga .................................... 327/112 |

FOREIGN PATENT DOCUMENTS

| | | |
|---|---|---|
| 64-86549 | 3/1989 | (JP) . |
| 2-166915 | 6/1990 | (JP) . |
| 6-104714 | 4/1994 | (JP) . |

* cited by examiner

Primary Examiner—My-Trang Nuton
(74) Attorney, Agent, or Firm—Burns, Doane, Swecker & Mathis, LLP

(57) ABSTRACT

An output buffer circuit which is formed by transistors 4 to 7 and 15 to 18 and in which the potential of the output signal OUT detected by a capacitance 8 or 19 is fed back to an output transistor 1 or 12 to control its gate potential so that the output signal OUT reaches the high- or low-level in a constant time regardless of a change in the value of a load capacitance connected to the output terminal.

10 Claims, 15 Drawing Sheets

(HIGH-LEVEL OUTPUT SIGNAL)

(HIGH-LEVEL OUTPUT SIGNAL)

OUTPUT BUFFER CIRCUIT

BACKGROUND OF THE INVENTION

1. Field of the Invention

The present invention relates to an output buffer circuit which is built in a semiconductor integrated circuit to yield an output signal of a predetermined level such as a high or low level in accordance with the level of the input signal.

2. Description of the Prior Art

FIG. 17 is a circuit diagram showing a conventional output buffer circuit, which is denoted generally by 100. Reference character A denotes an input signal which is applied to an input terminal; OE denotes an output enable signal which is applied to an output enable signal input terminal of the output buffer circuit 100; OUT denotes an output signal which is provided at the output terminal of the output buffer circuit 100; 101 denotes a P-channel transistor which functions as an output transistor for providing an high-level output signal; 102 denotes an N-channel transistor which functions as an output transistor for providing a low-level output signal; 103 denotes a NAND circuit; 104 denotes a NOR gate; and 105 and 106 denote inverters.

The operation of the prior art example will be described below in brief.

FIG. 18 is a graph for explaining the operation of the conventional output buffer circuit 100 depicted in FIG. 17. Upon input of the input signal A of the high-level to the input terminal when the output enable signal OE input to the output enable signal input terminal is high-level, the P-channel transistor 101 turns ON, and provides a high-level output signal OUT to the output terminal. Similarly, upon input of the input signal A of the low-level when the output enable signal OE is high-level, the N-channel transistor 102 turns ON, and provides a low-level output signal OUT.

In this instance, since the driving power of each of the P- and N-channel output transistors 101 and 102 is constant, a change in the load capacitance connected to the output terminal causes a change in the time in which the potential of the output signal from the output terminal reaches a predetermined high or low level. For example, as depicted in FIG. 1, when the load capacitance connected to the output terminal increases, the time for the potential of the output signal OUT to reach the high level becomes longer because of the fixed driving power of the P-channel transistor 101.

With the driving power of each output transistor heightened to solve this problem, however, when the load capacitance is small, the potential of the output signal OUT sharply changes to a predetermined level—this gives rise to a problem that an overshoot or undershoot of the output signal OUT is not suppressed. On the other hand, lowering of the driving power of the output transistor causes the problem of an increase in the time for the potential of the output signal OUT to reach a predetermined level when the load capacitance is larger.

FIG. 19 is a circuit diagram showing another conventional output buffer circuit, indicated generally by 110, which is identical in construction with the FIG. 17 example except that a capacitance C is connected between a node interconnecting gates of the P- and N-channel transistors 101 and 102 and the output terminal. Shown below the output buffer circuit 110 is its equivalent circuit with the output enable signal OE at the high level.

The output buffer circuit 110 of FIG. 19 is so configured as to settle the problem that the output buffer circuit 100 of FIG. 17 encounters. That is, the capacitance C is used to detect the potential at the output terminal. For example, when the potential of the output signal OUT varies, the potential is fed back to the gates of the P- and N-channel transistors 101 and 102 via the capacitance C. Accordingly, when the load capacitance connected to the output terminal changes in magnitude, the potential of the output signal OUT is transferred to the P- and N-channel transistors 101 and 102 via the capacitance C to control their operation and hence control the driving power of the output buffer circuit 110.

FIG. 20 is a block diagram depicting an input/output circuit in which there is incorporated the output buffer circuit 110 of FIG. 19. Reference numeral 110 denotes the output buffer circuit depicted in FIG. 19; 111 denotes an input buffer circuit; A denotes an input signal to an input terminal; OE denotes an output enable signal; Y denotes an output signal at an output terminal; IE denotes an input/output enable signal; and INOUT denotes an input/output circuit In the input/output circuit of FIG. 20, even when the output enable signal OE is not at the high level indicating that the output buffer circuit 110 is in the output state, that is, even when the output enable signal OE is low-level, a potential change at the input/output terminal INOUT triggers turning ON of the P- or N-channel transistor 101 or 102 via the capacitance C, leading to a malfunction.

SUMMARY OF THE INVENTION

It is therefore an object of the present invention to provide an output buffer circuit which enables the potential of its output signal to reach a predetermined value within a fixed time, that is, suppresses overshooting and undershooting of the output signal, even if the load capacitance connected to the output terminal undergoes a variation.

Another object of the present invention is to provide an output buffer circuit which will not malfunction even when built in an input/output circuit.

According to an aspect of the present invention, there is provided an output buffer circuit which comprises: an output transistor which supplies a voltage to an output signal to be output from an output terminal in accordance with the level of an input signal fed via an input terminal; a capacitance for detecting the potential of the output signal; feedback control means formed by a transistor and connected between the capacitance and the output transistor, for feeding back the potential of the output signal detected by the capacitance to control the gate potential of the output transistor and control the driving power of the output transistor so that the output signal reaches a predetermined level in a fixed time regardless of a change in the capacitance of a load connected to the output terminal; and a control transistor for turning OFF the operation of the feedback means when the output signal is not output.

According to another aspect of the present invention, the output transistor is a P-channel transistor for supplying a high-level voltage to the output signal when it is high-level, and the output transistor is an N-channel transistor for supplying a low-level voltage to the output signal when it is low-level.

According to another aspect of the present invention, the output transistor is an N-channel transistor for supplying a high-level voltage to the output signal when it is high-level, and the output transistor is a N-channel transistor for supplying a low-level voltage to the output signal when it is low-level.

According to another aspect of the present invention, the capacitance comprises a first capacitance for detecting the voltage of the output signal when it is high-level and a second capacitance for detecting the voltage of the output signal when it is low-level.

According to another aspect of the present invention, the output buffer circuit further comprises: a third capacitance connected in parallel to the first or second capacitance and having a capacitance value different from that of the first or second capacitance; and a first selector for selecting any one of the first, second and third capacitances.

According to another aspect of the present invention, the feedback control means further comprises: a plurality of transistors connected in series between the gate of the output transistor for generating a high- or low-level output signal and the ground, for feeding back the potential of the output signal detected by the first or second capacitance to the output transistor, and a second selector for selecting either one of the transistors to change the size of the transistor.

According to another aspect of the present invention, the output buffer circuit further comprises pulse generating means responsive to the input signal fed via the input terminal to output pulses of a predetermined level to the feedback control means for a predetermined period of time, thereby controlling the time for which the potential of the output signal detected by the capacitance is fed back to the gate of the output transistor.

According to another aspect of the present invention, the pulse generating means comprises: a first pulse generator which, at the time of generating a high-level output signal, applies high-level pulses to the feedback control means for a predetermined period of time, thereby controlling the driving power of an output transistor for generating the high-level output signal; and a second pulse generator which, at the time of generating a low-level output signal, applies low-level pulses to the feedback control means for a predetermined period of time, thereby controlling the driving power of an output transistor for generating the low-level output signal.

According to another aspect of the present invention, the pulse generating means further comprises: a third pulse generator connected in parallel to the first pulse generator, for applying high-level pulses to the feedback control means for a period of time different from that for which the first pulse generator applies the high-level pulses to the feedback control means; a fourth pulse generator connected in parallel to the second pulse generator, for applying low-level pulses to the feedback control means for a period of time different from that for which the second pulse generator applies the low-level pulses to the feedback control means; a third selector for selecting either one of the first and third pulse generators; and a fourth selector for selecting either one of the second and fourth pulse generators.

According to still another aspect of the present invention, the output buffer circuit further comprised: a first pull-down resistor connected to the first capacitance; a first pull-up resistor connected to the second capacitance; and a second pull-down resistor connected between the second capacitance and the gate of the transistor connected between the gate of an output transistor for generating the low-level output signal and the ground.

BRIEF DESCRIPTION OF THE DRAWINGS

Other objects, features and advantages of the present invention will become more apparent from the following description taken in conjunction with the accompanying drawings, in which.

DETAILED DESCRIPTION OF THE PREFERRED EMBODIMENTS

EMBODIMENT 1

Figure 1:
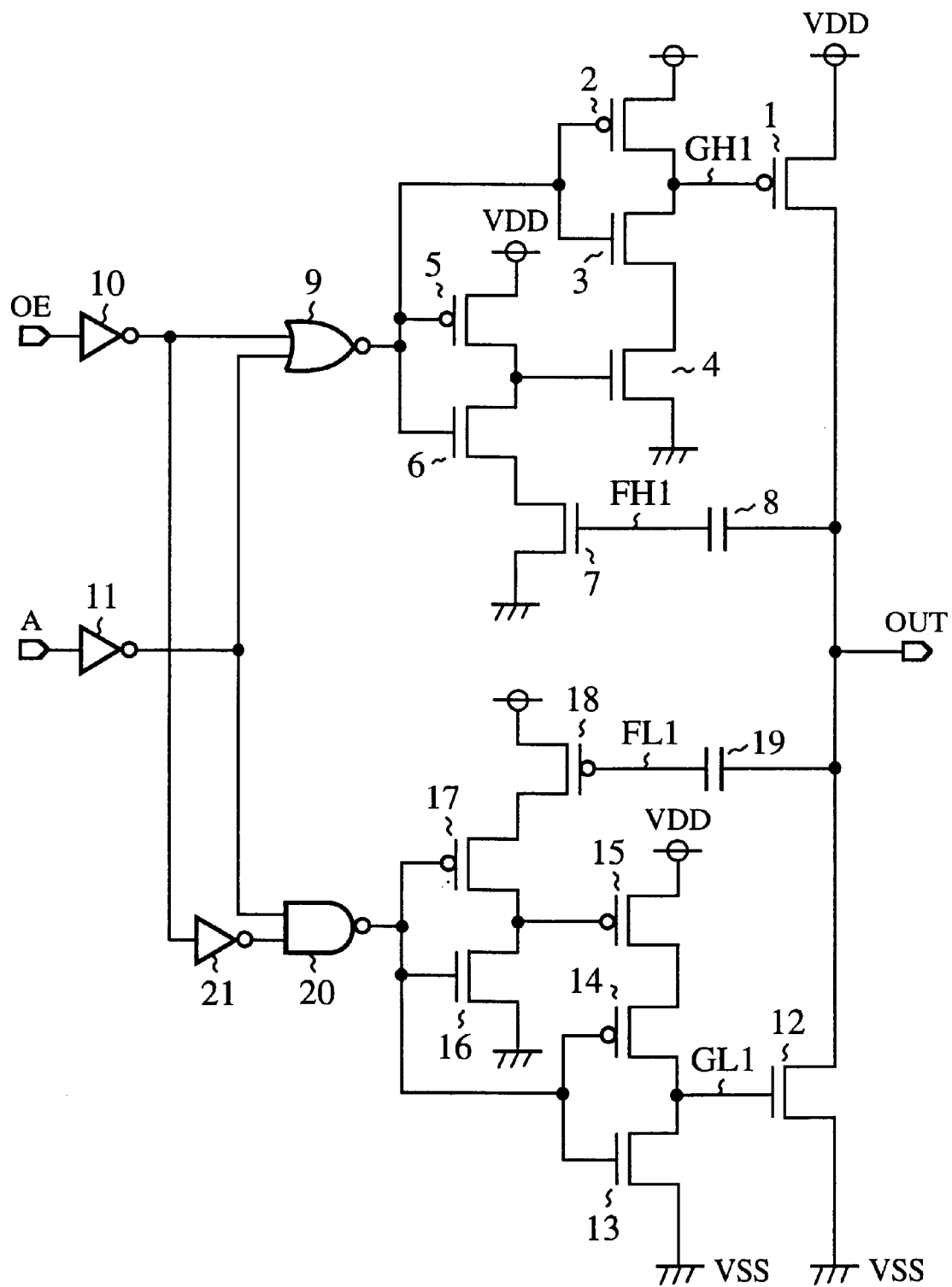
FIG. 1 is a circuit diagram of an output buffer circuit according to a first embodiment of the present invention.

FIG. 1 is a circuit diagram illustrating an output buffer circuit according to a first embodiment (Embodiment 1) of the present invention. Reference numeral 1 denotes an output P-channel transistor (an output transistor) for providing a high-level output signal OUT; 2 denotes a P-channel transistor (feedback control means) for turning OFF the P-channel transistor 1; 3 denotes an N-channel transistor (feedback control means) for turning ON the P-channel transistor 1; 8 denotes a high-level output capacitance (a first capacitance) for detecting a potential change of the output signal OUT, 4, 6 and 7 denote N-channel transistors (feedback control means) by which the potential change of the output signal OUT detected by the capacitance 8 is fed back to the P-channel transistor 1 in the case of generating the high-level output signal OUT, 5 denotes a P-channel transistor (a control transistor) for controlling the N-channel transistor 4 to turn it ON when no high-level output signal OUT is produced; GH1 denotes the potential at the gate of the P-channel transistor 1; and FH1 denotes the potential at the gate of the N-channel transistor 7.

Reference numeral 12 denotes an output N-channel transistor (an output transistor) for providing a low-level output signal OUT; 13 denotes an N-channel transistor (feedback means) for turning OFF the N-channel transistor 12; 14 denotes a P-channel transistor (feedback means) for turning ON the N-channel transistor 12; 19 denotes a low-level output capacitance (a second capacitance) for detecting a potential change of the output signal OUT; 15, 17 and 18 denote P-channel transistors (feedback means) by which the potential change of the output signal OUT detected by the capacitance 19 is fed back to the N-channel transistor 12 in the case of generating the low-level output signal OUT; 16 denotes an N-channel transistor (a control transistor) for controlling the P-channel transistor 15 to turn it ON when no low-level output signal OUT is produced; GL1 denotes the potential at the gate of the N-channel transistor 12; FL1 denotes the potential at the gate of the P-channel transistor 18; 10, 11 and 21 denote inverters; 9 denotes a NOR gate; and 20 denotes a NAND gate.

Figure 2:
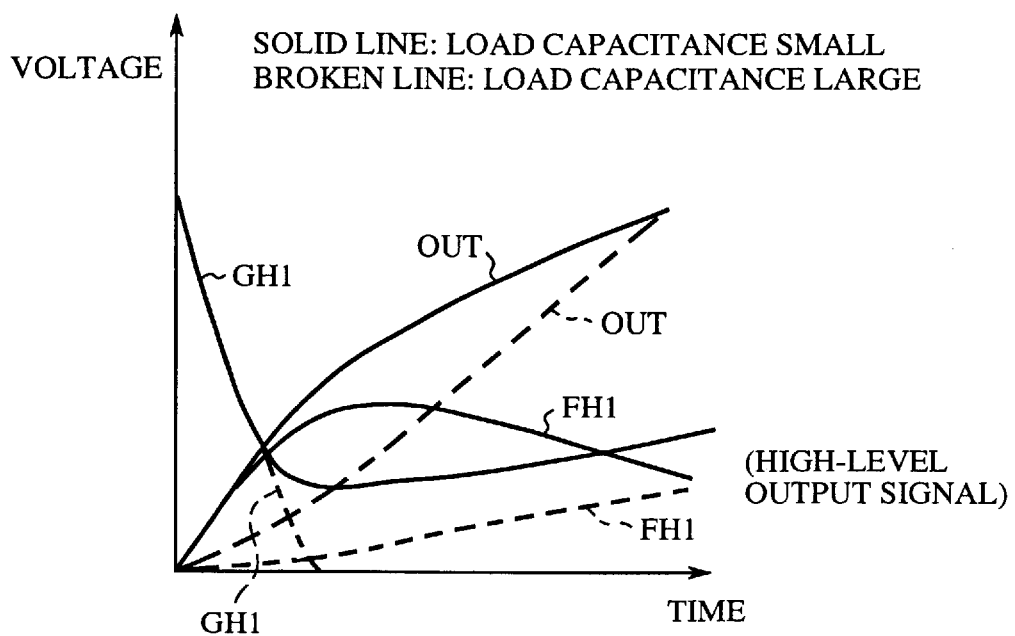
FIG. 2 is a graph explanatory of the operation of the output buffer circuit depicted in FIG. 1.

Turning next to FIG. 2, the operation of this embodiment will be described below.

To deliver the high-level output signal OUT from the output terminal, a high-level output enable signal OE is applied to an output enable signal input terminal of the output buffer circuit Upon input of a high-level input signal A to the input terminal in this instance, that is, when the potential of the input signal A changes from the low to the high level, the potential GH1 at the gate of the P-channel transistor 1 drops, allowing the transistor 1 to turn ON. As a result, the power-supply voltage VDD is fed via the P-channel transistor 1 to the output terminal, increasing the potential of the output signal OUT.

When the load capacitance connected to the output terminal is small the potential o the output signal OUT sharply rises and the potential FH1 at the gate of the N-channel transistor 7 also sharply rises correspondingly. As a result, the N-channel transistor 7 mns ON, while at the same time the P-channel transistor 5 turns OFF and the N-channel transistor 6 ON, and consequently, the N-channel transistor 4 turns OFF. Accordingly, the potential GH1 does not readily become low. This suppresses the driving power of the P-channel transistor 1. Hence, the potential of the output signal OUT gently goes up to the high level.

On the other hand, when the load capacitance connected to the output terminal is large, the potential of the output signal OUT gently rises, and hence the potential FH1 hardly rises. The P-channel transistor 5 is OFF and the N-channel transistor 6 ON, but since the N-channel transistor 7 is not ON, the N-channel transistor 4 remains ON. Accordingly, the potential GH1 remains low and no control is made to suppress the driving power of the P-channel transistor 1. As a result, the P-channel transistor 1 remains ON and permits the passage therethrough of the power-supply voltage VDD to the output terminal, causing the voltage of the output signal OUT to rise toward the high level.

Hence, at the time of delivering the high-level output signal OUT from the output terminal, even if the capacitance value of the load capacitance connected to the output terminal varies, a potential change of the output signal OUT is detected and the driving power of the P-channel transistor 1 as the output buffer transistor is controlled accordingly. As depicted in FIG. 2, the rise time of the output signal OUT is constant regardless of the capacitance value of the load capacitance. Furthermore, since the output signal OUT from the output buffer circuit does not sharply change, its overshoot and variation can be suppressed.

Figure 3:
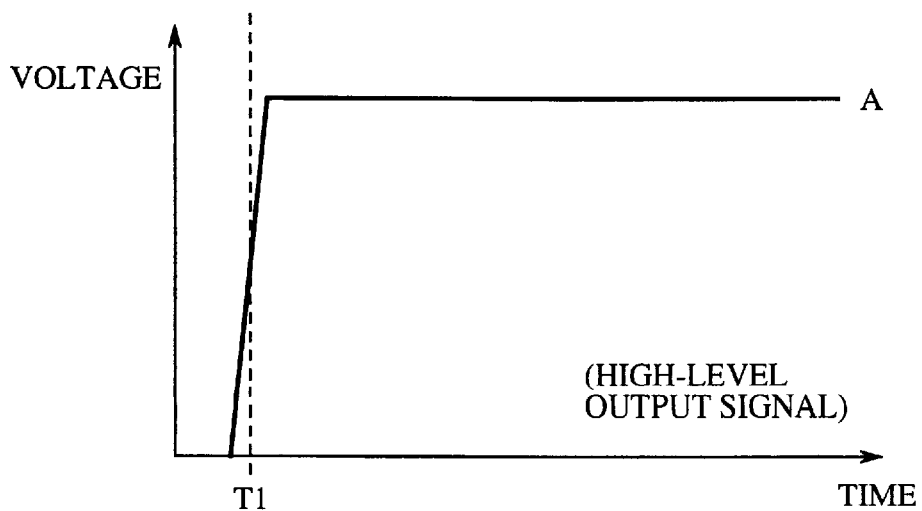
FIG. 3 is a graph explanatory of the operation of the output buffer circuit depicted in FIG. 1.
Figure 4:
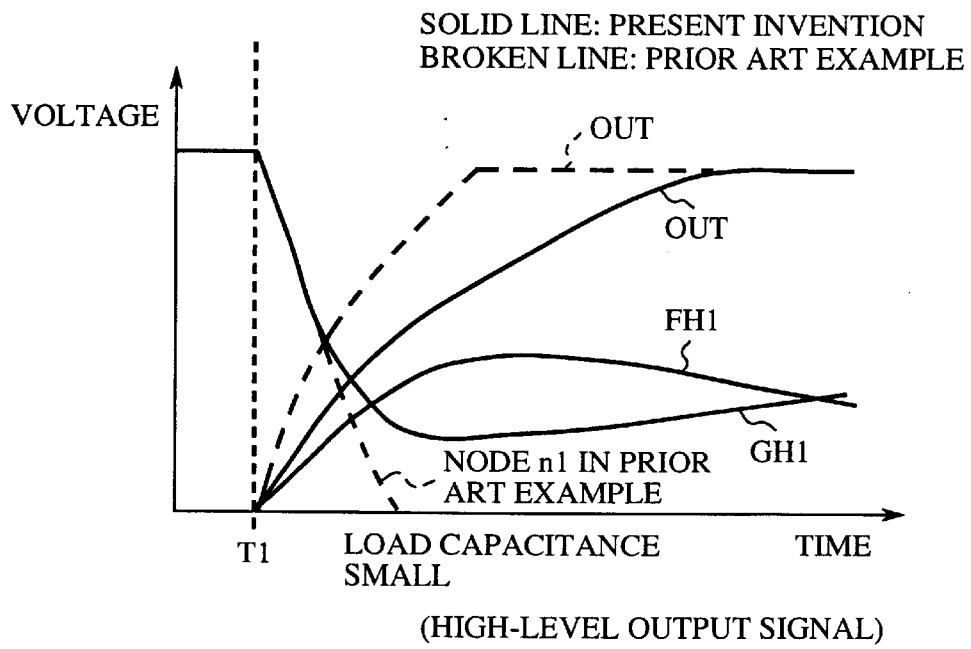
FIG. 4 is a graph explanatory of the operation of the output buffer circuit depicted in FIG. 1.
Figure 5:
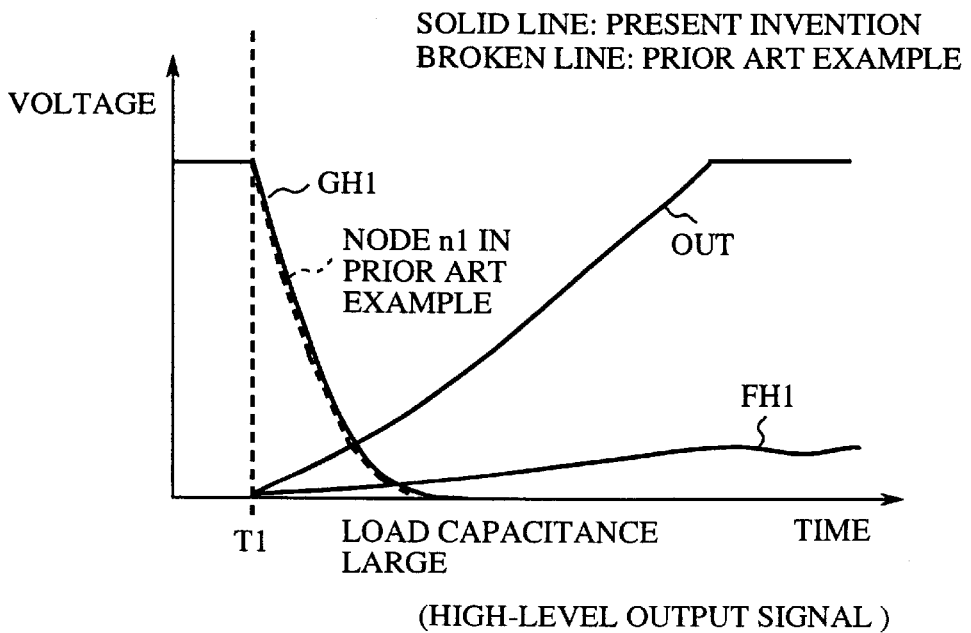
FIG. 5 is a graph explanatory of the operation of the output buffer circuit depicted in FIG. 1.

FIGS. 3 through 5 are graphs for explaining the operation of the output buffer circuit shown in FIG. 1. FIG. 3, in particular, shows the case where the input signal A to the input terminal changes from the low to the high level at timing T1. FIG. 4 shows operations when the load capacitance connected to the output terminal is small; the solid lines indicate operations of the output buffer circuit of this embodiment and the broken lines operations of a conventional output buffer circuit. FIG. 5 shows operations when the load capacitance connected to the output terminal is large; the solid lines indicate operations of the output buffer circuit of this embodiment and the broken lines operations of the prior art example.

As depicted in FIG. 4, when the load capacitance connected to the output terminal is small, the voltage of the output signal OUT from the output buffer circuit of this embodiment rises more gently than in the case of the prior art example. On the other hand, when the load capacitance is small, the voltage of the output signal OUT reaches the high level in about the same time as in the prior art example as depicted in FIG. 5. That is, when the load capacitance is large, the potential of the output signal OUT is not fed back to the P-channel transistor 1, so that the rise time of the output signal OUT is equal to the rise time in the prior art example.

A comparison of FIGS. 4 and 5 reveals that in the output buffer circuit of Embodiment 1 the rise time of the input signal A from the low to the high level is constant regardless of the value of the load capacitance connected to the output terminal. In other words, the time between the application of the input signal A to the input terminal and the outputting of the output signal OUT from the output terminal can be made constant independently of the value of the load capacitance.

Figure 6:
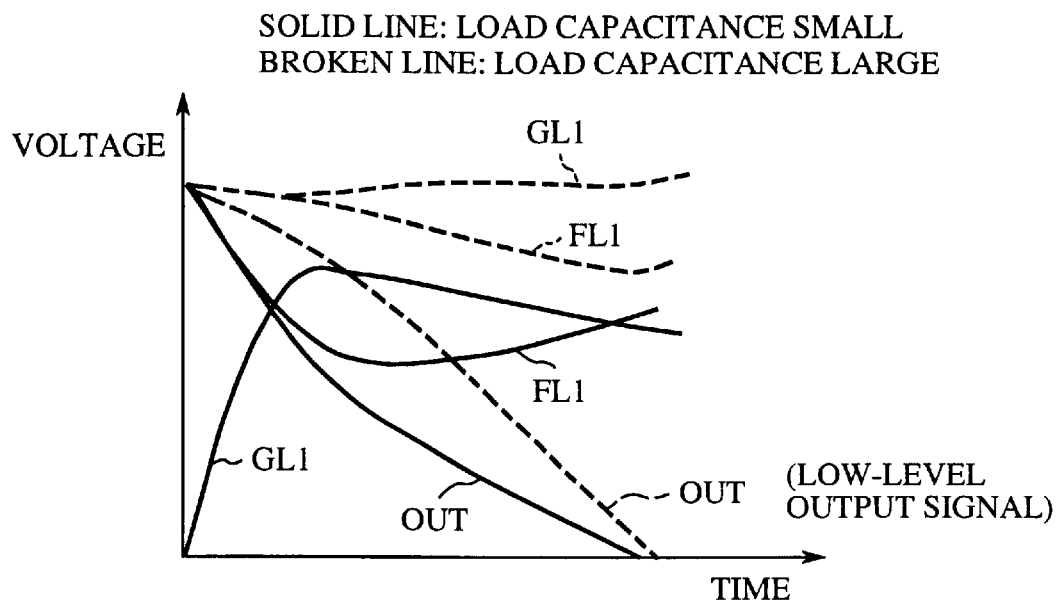
FIG. 6 is a graph explanatory of the operation of the output buffer circuit depicted in FIG. 1.

FIG. 6 is explanatory of the operation of the output buffer circuit shown in FIG. 1.

In the case of providing the output signal OUT of the low level, too, the high-level output enable signal OE is applied to the output enable signal input terminal of the output buffer circuit as is the case of producing the high-level output signal OUT. Upon application of the input signal A of the low level to the input signal, that is, when the potential of the input signal changes from the high to the low level, the potential GL1 rises and the N-channel transistor 12 turns ON. As a result, the potential of the output signal OUT decreases.

When the load capacitance of a device (not shown) connected to the output terminal is small, the potential of the output signal OUT sharply drops and the potential FL1 also drops accordingly. As a result, the P-channel transistor 18 turns ON and the N-channel transistor 16 OFF, but since the P-channel transistor 17 is ON, the P-channel transistor 15 tuns OFF. Hence, the potential GL1 does not readily go high. Accordingly, the potential of the output signal OUT gently decreases. This means control of suppressing the driving power of the N-channel transistor 12.

When the load capacitance connected to the output terminal is large, the potential of the output signal OUT gently decreases, but since the potential FL1 hardly drops, the P-channel transistor 18 does not turn ON. And since the N-channel transistor 16 is OFF and P-channel transistor 17 ON, the N-channel transistor 13 turns OFF but P-channel transistor 14 turns ON and the P-channel transistor 15 remains ON; the potential GL1 remains high, and the N-channel transistor 12 remains ON. Hence, the driving power of the N-channel transistor 12 is not suppressed.

Even if the value of the load capacitance connected to the output terminal changes when the output signal OUT is low-level, a change in its potential is detected and the driving power of the N-channel transistor 12 functioning as the output buffer transistor is controlled accordingly. Hence, in the case of providing the low-level output signal OUT, too, he time for the output signal OUT to reach the low level is constant irrespective of the value of the load capacitance as depicted in FIG. 6. Moreover, since the output signal OUT from the output buffer circuit does not sharply changes, its undershoot or similar variation can be suppressed.

As described above, according to Embodiment 1, the output buffer circuit has a construction in which the capacitance for detecting the potential of the output signal OUT and its detected potential are fed back to the output transistor. Accordingly, the driving power of the output transistor can be controlled in accordance with the value of the load capacitance connected to the output terminal, and even if the capacitance value changes, the time for the output signal OUT to reach a predetermined level can be held constant. Furthermore, since the output buffer circuit of this embodiment is so constructed as not to feed back the potential of the output signal OUT to the output transistor when no output signal OUT is provided to the output terminal, there is no fear of malfunctioning of the output buffer circuit even if it is built in an input/output circuit.

EMBODIMENT 2

Figure 7:
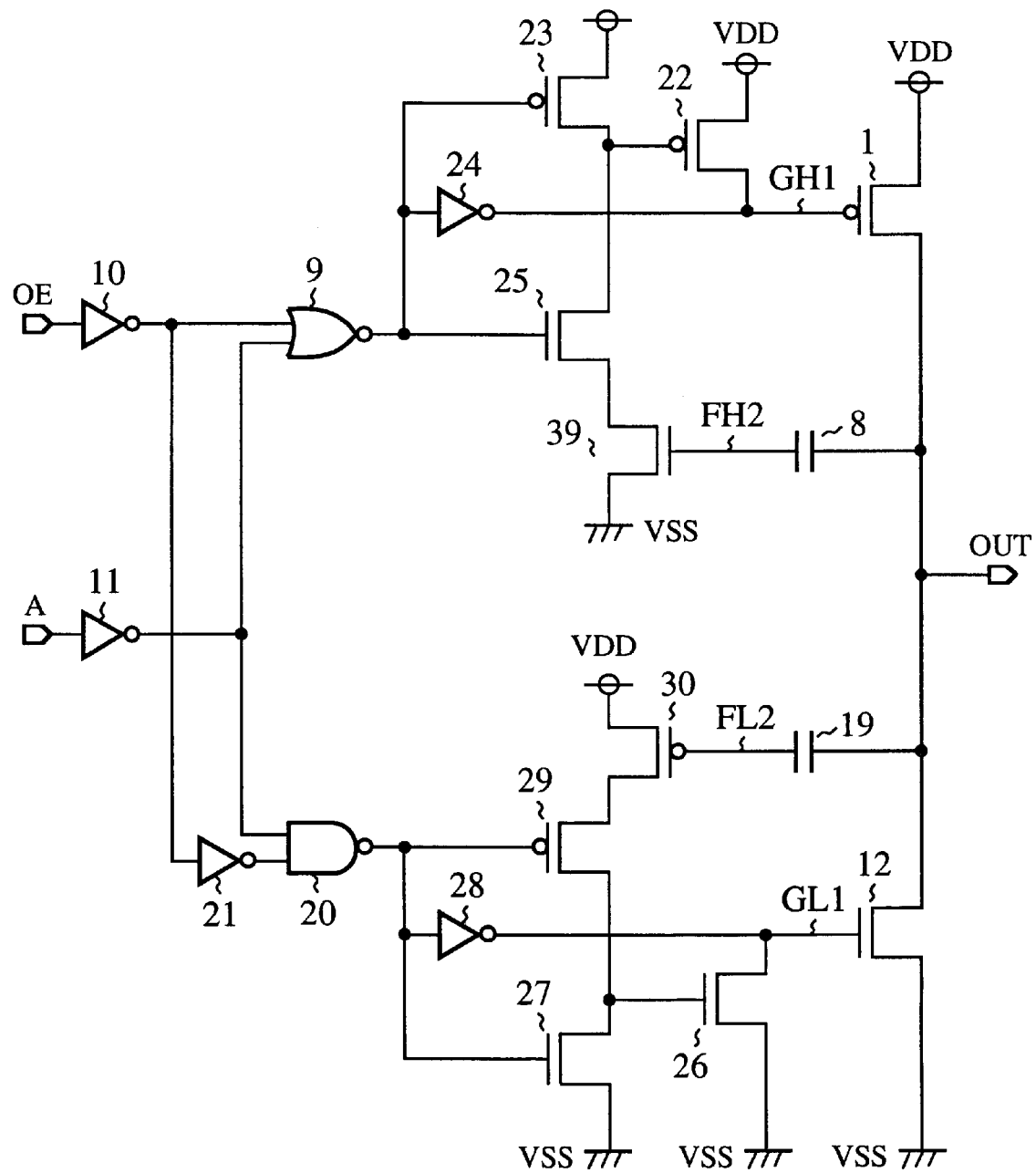
FIG. 7 is a circuit diagram of an output buffer circuit according to a second embodiment of the present invention.

FIG. 7 is a circuit diagram of the output buffer circuit according to a second embodiment (Embodiment 2) of the present invention. Reference numerals 22, 25 and 39 denote P-, N- and N-channel transistors (feedback means) by which a potential change of the output signal OUT detected by the capacitance 8 is fed back to the P-channel transistor 1 when the output signal OUT of the high level is output from the output terminal. Reference numeral 23 denotes a P-channel transistor (a control transistor) controls the P-channel transistor 2 to turn it OFF when no high-level output signal OUT is produced. FH2 denotes a potential at the gate of the N-channel transistor 39.

Reference numerals 26, 29 and 30 denote N-, P- and P-channel transistors (feedback means) by which a potential change of the output signal OUT detected by the capacitance 19 is fed back to the N-channel transistor 12 when the output signal OUT of the low level is output from the output terminal. Reference numeral 27 denotes an N-channel transistor (a control transistor) for controlling the P-channel transistor 2 to turn it OFF when no low-level output signal OUT is produced. FL2 denotes a potential at the gate of the P-channel transistor 30. Reference numerals 24 and 28 denote inverters. The other constituents are the same as those of the output buffer circuit of Embodiment 1, and hence they are identified by the same reference numerals.

Figure 8:
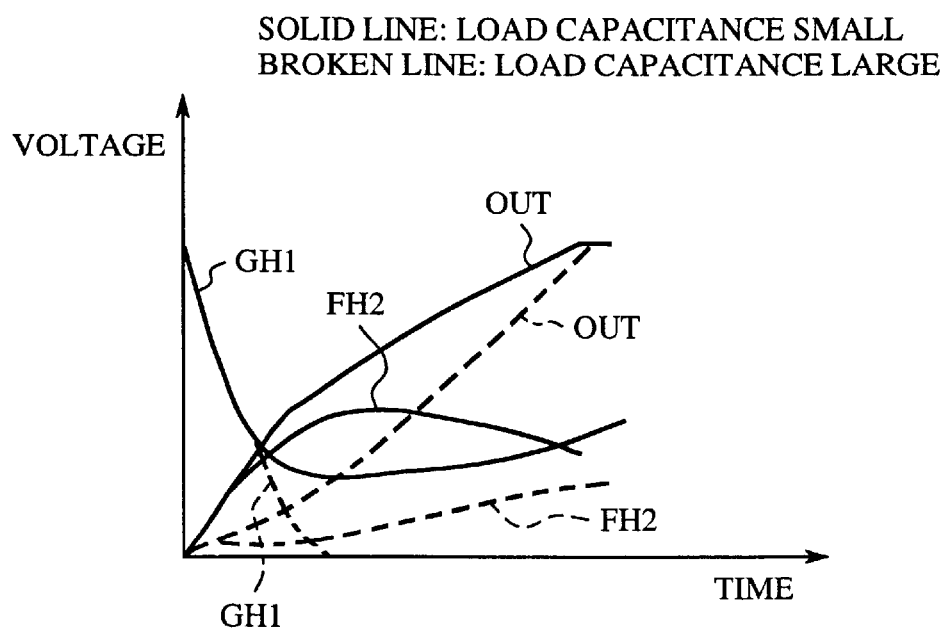
FIG. 8 is a graph explanatory of the operation of the output buffer circuit depicted in FIG. 7.

Turning next to FIG. 8, the operation of this embodiment will be described below.

To deliver the high-level output signal OUT from the output terminal, a high-level output enable signal OE is applied to the output enable signal input terminal of the output buffer circuit. Upon input of a high-level input signal A to the input terminal in this instance, that is, when the potential of the input signal A changes from the low to the high level, the potential GH1 at the gate of the P-channel transistor 1 drops, allowing the transistor 1 to turn ON. As a result, the power-supply voltage VDD is fed via the P-channel transistor 1 to the output terminal, increasing the potential of the output signal OUT.

When the load capacitance connected to the output terminal is small, the potential of the output signal OUT sharply rises and the potential FH2 also rises, turning ON the N-channel transistor 39. And, since the P-channel transistor 22 also turns ON, the potential GH1 does not readily go low and the output signal OUT gently goes up to the high level.

On the other hand, when the load capacitance is large, the potential of the output signal OUT gradually rises, and hence the potential FH2 does not go high and the N-channel transistor 39 remains in the OFF state. And, since the P-channel transistor 22 does not turn ON, either, the potential GH1 goes low and the P-channel transistor 1 turns ON, permitting the passage therethrough of the power-supply voltage VDD to the output terminal.

As described above, when the load capacitance connected to the output terminal is large, the output signal OUT gently changes to the high level and the potential FH2 hardly rises; therefore, the N- and P-channel transistors 39 and 22 do not turn ON and the potential GH1 remains at the low level. That is, the more gentle the potential change of the output signal OUT is, the longer the gate potential GH1 of the P-channel transistor 1 remains low, and consequently, no control is made to suppress the driving power of the P-channel transistor 1.

Accordingly, it can be seen from FIG. 8 that in the output buffer circuit of this embodiment, too, the rise time of the input signal A from the low to the high level when the output enable signal OE is high is constant regardless of the value of the load capacitance connected to the output terminal. In other words, the time between the application of the input signal A to the input terminal and the outputting of the output signal OUT from the output terminal when the output enable signal OE is high can be made constant independently of the value of the load capacitance.

The circuit structure for generating the low-level output signal OUT in the output buffer circuit is identical with the circuit structure for generating the high-level output signal OUT, except that the N- and P-channel transistors in the latter are replaced with P- and N channel transistors. Accordingly, the operation for generating the low-level output signal OUT is basically identical with the operation for generating the high-level output signal OUT, and hence no description will be repeated.

As described above, according to Embodiment 2, the output buffer circuit has a construction in which the capacitance for detecting the potential of the output signal OUT and its detected potential are fed back to the output transistor. Accordingly, the driving power of the output transistor can be controlled in accordance with the value of the load capacitance connected to the output terminal, and even if the capacitance value changes, the time for the output signal OUT to reach a predetermined level can be held constant. Furthermore, since the output buffer circuit of this embodiment is so constructed as not to feed back the potential of the output signal OUT to the output transistor when no output signal OUT is provided to the output terminal, there is no fear of malfunctioning of the output buffer circuit even if it is built in an input/output circuit.

EMBODIMENT 3

Figure 9:
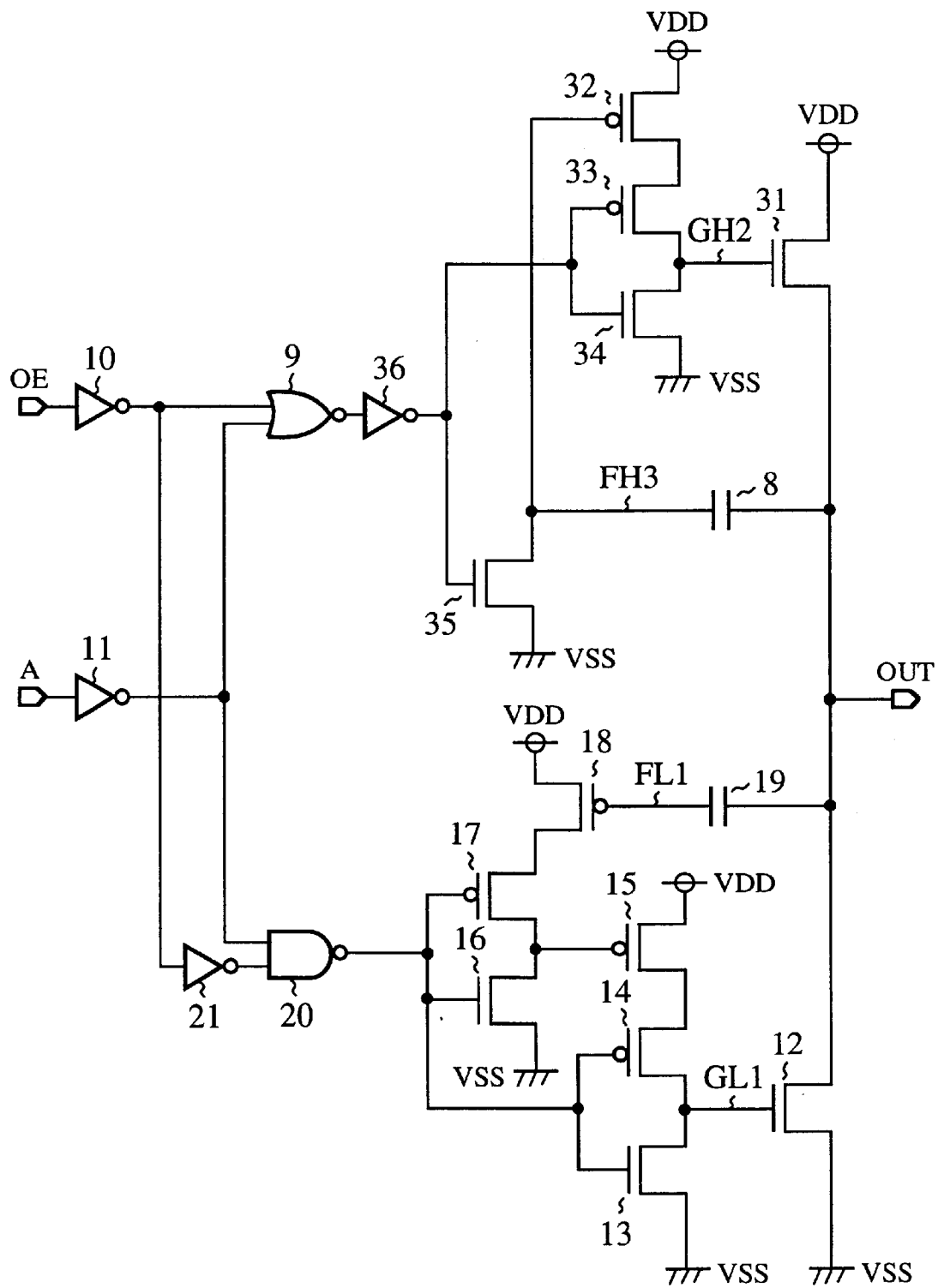
FIG. 9 is a circuit diagram of an output buffer circuit according to a third embodiment of the present invention.

FIG. 9 is a circuit diagram illustrating an output buffer circuit according to a third embodiment (Embodiment 3) of the present invention. Reference numeral 31 denotes an output N-channel transistor (an output transistor) for providing a high-level output signal OUT; 34 denotes an N-channel transistor for turning OFF the N-channel transistor; 33 denotes a P-channel transistor for turning ON the N-channel transistor 31; 32 denotes a P-channel transistor (feedback means) by which a potential change of the output signal OUT detected by the capacitance 8 is fed back to the N-channel transistor 31 when the high-level output signal OUT is produced; 35 denotes a N-channel transistor (a control transistor) for controlling the P-channel transistor 32 to turn it ON in advance when no high-level output signal OUT is generated; GH2 denotes the potential at the gate of the N-channel transistor 31; FH3 denotes the potential at the gate of the P-channel transistor 32; and 36 denotes an inverter The other constituents are the same as those of the output buffer circuit of Embodiment 1, and hence they are identified by the same reference numerals.

Figure 10:
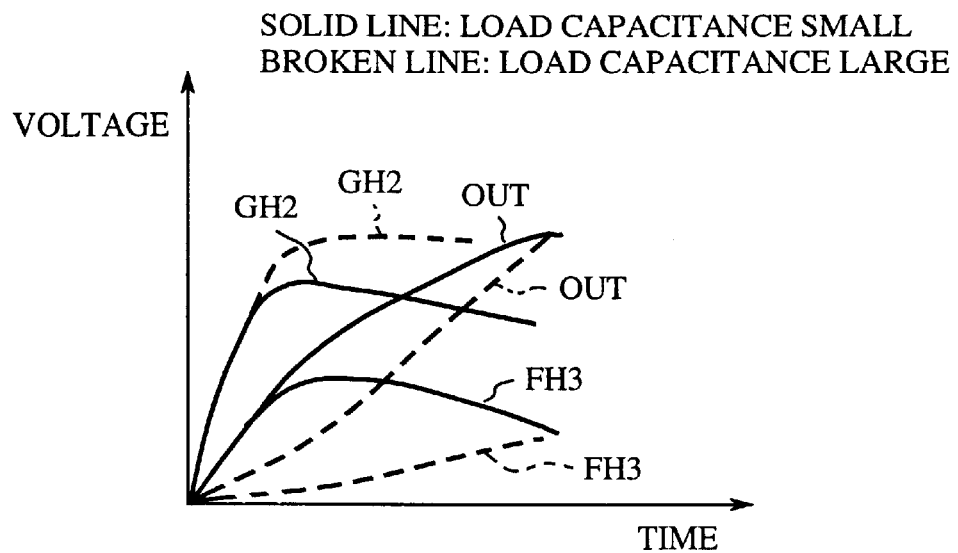
FIG. 10 is a graph explanatory of the operation of the output buffer circuit depicted in FIG. 9.

Referring next to FIG. 10, the operation of this embodiment will be described below.

To deliver the high-level output signal OUT from the output terminal, a high-level output enable signal OE is applied to the output enable signal input terminal of the output buffer circuit. Upon input of a high-level input signal A to the input terminal in this instance, that is, when the potential of the input signal A changes from the low to the high level, the potential GH2 at the gate of the N-channel transistor 31 rises, allowing the transistor 31 to turn ON. As a result, the power-supply voltage VDD is fed via the N-channel transistor 31 to the output terminal, increasing the potential of the output signal OUT.

When the load capacitance connected to the output terminal is small, the potential of the output signal OUT sharply rises and the gate potential FH3 of the P-channel transistor 32 also rises. As a result, the P-channel transistor 32 turns OFF and the gate potential GH2 of the N-channel transistor 31 does not go high—this serves to suppress its driving power. Hence, the output signal OUT gently goes high.

On the other hand, when the load capacitance is large, the potential of the output signal OUT gently rises, and hence the gate potential GH3 hardly rises. Accordingly, the P-channel transistor 32 remains in the ON state and the P-channel transistor 33 is also in the ON state, holding the gate potential FH2 of the N-channel transistor 31 at the high level. This means that no control is made to suppress the driving power of the N-channel transistor 31. Thus, the N-channel transistor 31 remains ON and permits the passage therethrough of the power-supply voltage VDD to the output terminal, causing the voltage of the output signal OUT to rise toward the high level.

Hence, at the time of delivering the high-level output signal OUT from the output terminal, even if the capacitance value of the load capacitance connected to the output terminal varies, a potential change of the output signal OUT is detected and the driving power of the N-channel transistor 31 as the output buffer transistor is controlled accordingly Therefore, as depicted in FIG. 10, the rise time of the output signal OUT is constant regardless of the capacitance value of the load capacitance, making it possible to suppress an overshoot and an undershoot of the output signal OUT. The operation for providing an low-level output signal OUT from the output terminal is the same as in the case of the output buffer circuit of Embodiment 1 shown in FIG. 11, and hence no description will be repeated.

As described above, according to Embodiment 3, the output buffer circuit has a construction in which the capacitance for detecting the potential of the output signal OUT and its detected potential are fed back to the output transistor. Accordingly, the driving power of the output transistor can be controlled in accordance with the value of the load capacitance connected to the output terminal, and even if the capacitance value changes, the time for the output signal OUT to reach a predetermined level can be held constant. Furthermore, since the output buffer circuit of this embodiment is so constructed as not to feed back the potential of the output signal OUT to the output transistor when no output signal OUT is provided to the output terminal, there is no fear of malfunctioning of the output buffer circuit even if it is built in an input/output circuit.

EMBODIMENT 4

Figure 11:
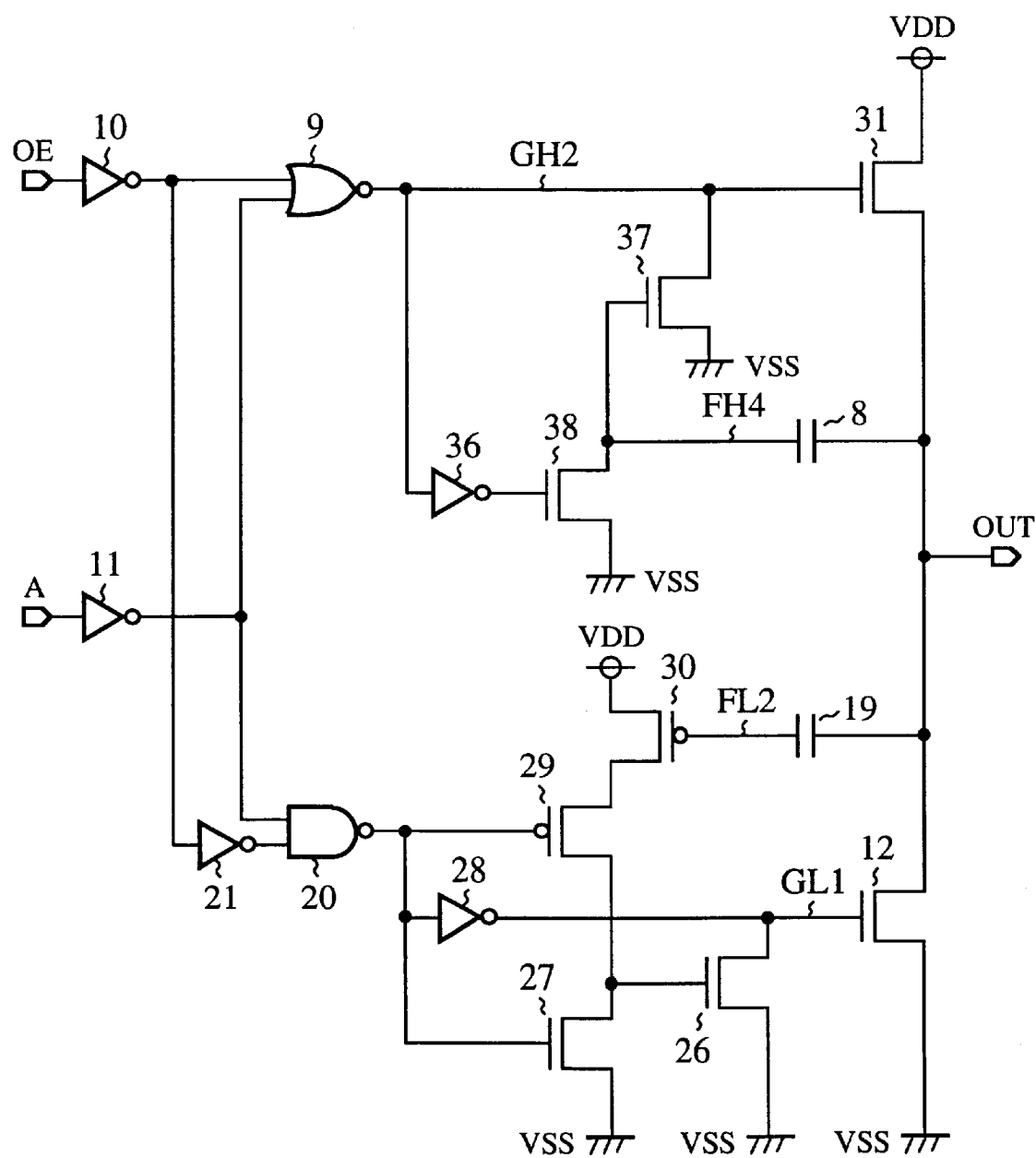
FIG. 11 is a circuit diagram of an output buffer circuit according to a fourth embodiment of the present invention.

FIG. 11 is a circuit diagram illustrating an output buffer circuit according to a fourth embodiment (Embodiment 4) of the present invention. Reference numeral 37 denotes an N-channel transistor (feedback means) by which, at the time of providing a high-level output signal OUT, its potential change detected by the capacitance 8 is fed back to the N-channel transistor 31; 38 denotes an N-channel transistor (a control transistor) for controlling the N-channel transistor 37 to turn it OFF when no high-level output signal OUT is generated; GH2 denotes the potential at the gate of the N-channel transistor 31; and FH4 denotes the potential at the gate of the N-channel transistor 37. The other constituents are the same as those of the output buffer circuits of Embodiments 2 and 3 shown in FIGS. 7 and 9, and hence they are identified by the same reference numerals.

Figure 12:
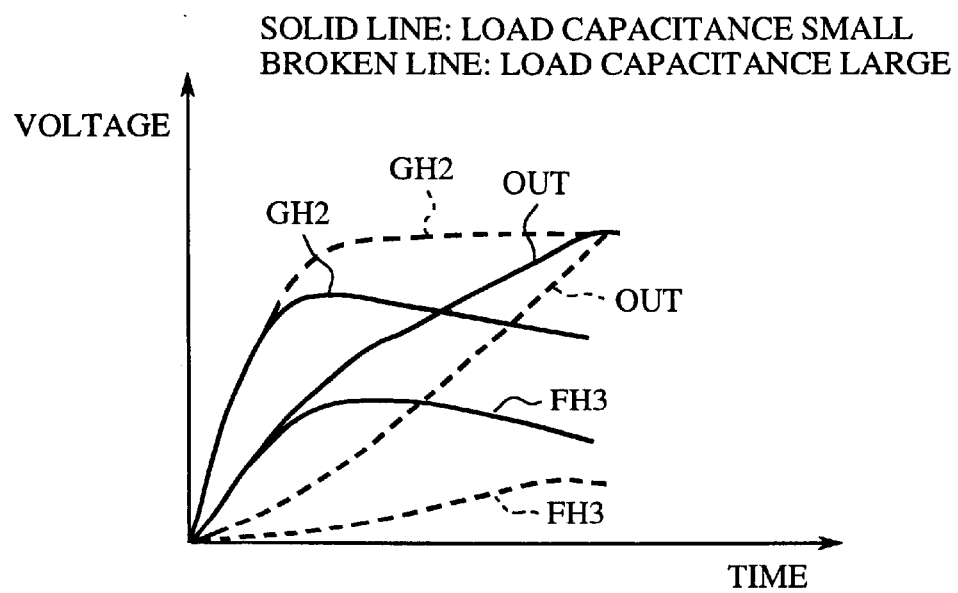
FIG. 12 is a graph explanatory of the operation of the output buffer circuit depicted in FIG. 11.

Referring next to FIG. 12, the operation of this embodiment will be described below.

To deliver the high-level output signal OUT from the output terminal, a high-level output enable signal OE is applied to the output enable signal input terminal of the output buffer circuit. Upon input of a high-level input signal A to the input terminal in this instance, that is, when the potential of the input signal A changes from the low to the high level, the potential GH2 at the gate of the N-channel transistor 31 rises, allowing the transistor 31 to turn ON. As a result, the power-supply voltage VDD is fed via the N-channel transistor 31 to the output terminal, increasing the potential of the output signal OUT.

When the load capacitance connected to the output terminal is small, the potential of the output signal OUT sharply rises and the gate potential FH4 of the N-channel transistor 37 also rises. As a result, the N-channel transistor 37 turns ON and the gate potential GH2 of the N-channel transistor 31 does not readily go high. Hence, the output signal OUT gently goes high.

On the other hand, when the load capacitance is large, the potential of the output signal OUT gently rises, and hence the gate potential FH4 hardly rises and the N-channel transistor 37 does not turn ON. Accordingly, the gate potential GH2 of the N-channel transistor 31 remains at the high level. That is, the more gentle the potential change of the output signal OUT is, the longer the gate potential GH2 of the N-channel transistor 31 remains high. This means that no control is made to suppress the driving power of the N-channel transistor 31.

Hence, at the time of delivering the high-level output signal OUT from the output terminal even if the capacitance value of the load capacitance connected to the output terminal varies, a potential change of the output signal OUT is detected and the driving power of the N-channel transistor 31 as the output buffer transistor is controlled accordingly. Therefore, as depicted in FIG. 12, the rise time of the output signal OUT is constant regardless of the capacitance value of the load capacitance. Furthermore, since the output signal OUT from the output buffer circuit does no sharply change, it is possible to suppress an overshoot of the output signal OUT. The operation for providing a low-level output signal OUT from the output terminal is the same as in the case of the output buffer circuit of Embodiment 2 shown in FIG. 7, and hence no description will be repeated.

As described above, according to Embodiment 4, the output buffer circuit has a construction in which the capacitance for detecting the potential of the output signal OUT and its detected potential are fed back to the output transistor. Accordingly, the driving power of the output transistor can be controlled in accordance with the value of the load capacitance connected to the output terminal, and even if the capacitance value changes, the time for the output signal OUT to reach a predetermined level can be held constant. Furthermore, since the output buffer circuit of this embodiment is so constructed as not to feed back the potential of the output signal OUT to the output transistor when no output signal OUT is provided to the output terminal, there is no fear of malfunctioning of the output buffer circuit even if it is built in an input/output circuit.

EMBODIMENT 5

Figure 13:
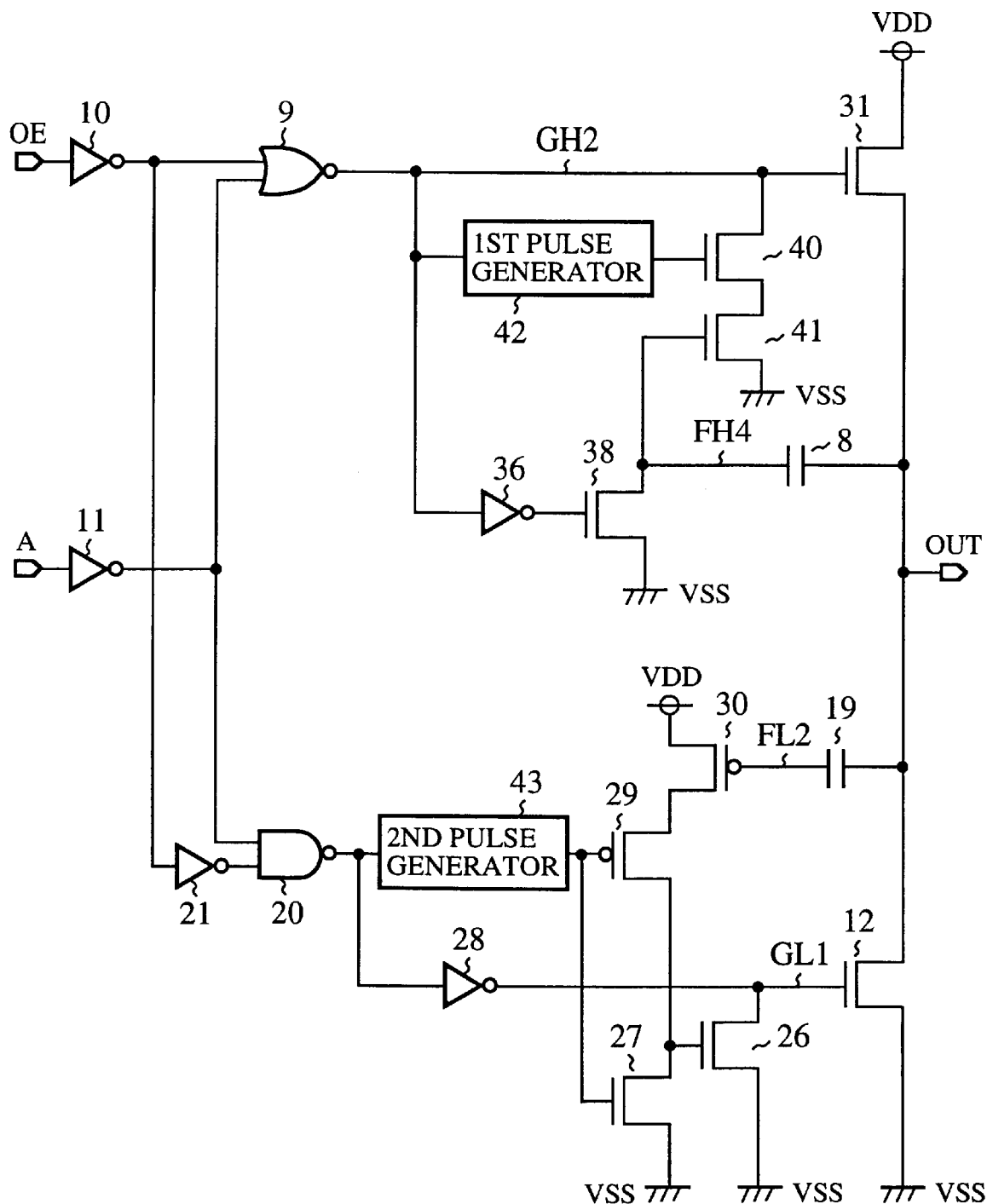
FIG. 13 is a circuit diagram of an output buffer circuit according to a fifth embodiment of the present invention.

FIG. 13 is a circuit diagram illustrating an output buffer circuit according to a fifth embodiment (Embodiment 5) of the present invention. Reference numerals 40 and 41 denote N-channel transistors (feedback means) connected between the gate of the N-channel transistor 31 and the ground; 42 denotes a first pulse generator (pulse generating means) which responds to a high-level input signal from the NOR gate 9 to output high-level pulses for a predetermined time, the first pulse generator 42 being connected between the gate of the N-channel transistor 40 and the NOR gate 9; 43 denotes a second pulse generator (pulse generating means) which responds to a low-level input signal from the NAND gate 20 to output low-level pulses for a predetermined time, the second pulse generator 43 being connected between the gate of the N-channel transistor 29 and the NAND gate 20. The other constituents are the same as those of the output buffer circuit according to Embodiment 4 depicted in FIG. 11, and hence they are identified by the same reference numerals.

Next the operation of this embodiment will be described below.

To deliver the high-level output signal OUT from the output terminal, a high-level output enable signal OE is applied to the output enable signal input terminal of the output buffer circuit. Upon input of a high-level input signal A to the input terminal in this instance, that is, when the potential of the input signal A changes from the low to the high level, the potential GH2 at the gate of the N-channel transistor 31 rises, allowing the transistor 31 to turn ON. As a result, the power-supply voltage VDD is fed via the N-channel transistor 31 to the output terminal, increasing the potential of the output signal OUT.

When supplied with a high-level signal from the NOR gate 9, the first pulse generator 42 outputs high-level pulses to the N-channel transistor 40 for a predetermined time, for instance, several nanoseconds. Accordingly, when the load capacitance connected to the output terminal is small, the gate potential FH4 sharply rises up to the high level, turning ON the N-channel transistor 41. Furthermore, when supplied with the high-level pulses from the first pulse generator 42, for instance, for several nanoseconds, the N-channel transistor 40 turns ON and the gate potential GH2 drops, turning OFF the N-channel transistor 31.

Accordingly, when the load capacitance is small, it is possible to control the rise time of the output signal OUT to the high level by feeding back its potential to the N-channel transistor 31 to control its operation. Since the first pulse generator 42 no longer outputs the high-level pulses when the output buffer circuit has reached an output steady state, the N-channel transistor 40 turns OFF, but the N-channel transistor 31 as the output transistor remains ON, providing a stable supply therethrough of the voltage VDD to the output signal OUT. In this way, the first pulse generator 42 defines the period of feeding back the potential of the output signal OUT to the N-channel transistor 31. Hence, by the feedback of the potential of the output signal to the N-channel transistor 31 serving as the output transistor, the output buffer circuit is capable not only of controlling the driving power of the transistor 31 but also of stably providing the high-level output signal OUT even after having reached the output steady state.

The second pulse generator 43, when supplied with a low-level signal from the NAND gate 20, outputs low-level pulses to the P-channel transistor 29 for a predetermined time, for instance, several nanoseconds. Accordingly, when the load capacitance connected to the output terminal is small, the gate potential FL2 sharply goes down to the low level, turning ON the P-channel transistor 30. Furthermore, when supplied with the low-level pulses from the second pulse generator 43, for instance, for several nanoseconds, the N-channel transistor 29 turns ON and the gate potential GL1 drops, tuning OFF the N-channel transistor 12.

Accordingly, when the load capacitance is small, it is possible to control the rise time of the output signal OUT to the high level by feeding back its potential to the N-channel transistor 12 to control its operation. Since the second pulse generator 43 no longer outputs the low-level pulses when the output buffer circuit has reached an output steady state, the P-channel transistor 29 turns OFF, but the N-channel transistor 12 as the output transistor remains ON, providing a stable supply therethrough of the voltage VDD to the output signal OUT. In this way, the second pulse generator 43 defines the period of feeding back the potential of the output signal OUT to the N-channel transistor 12. Hence, by the feedback of the potential of the output signal to the N-channel transistor 12 serving as the output transistor, the output buffer circuit is capable of stably providing the low-level output signal OUT even after having reached the output steady state.

As described above, according to this embodiment, the output buffer circuit has a construction in which pulse generators, each of which generates pulses of a predetermined potential for a predetermined period of time, are each provided on the line for feeding back the potential of the output signal OUT to the output transistor; hence, it is possible to change the period of feeding back the potential of the output signal OUT to the output transistor. That is, by the feedback of the potential of the output signal OUT, the output buffer circuit according to Embodiment 5 is capable not only of controlling the driving power of the output transistor but also of stably providing the output signal OUT of the predetermined level even after the circuit has reached the output steady state.

EMBODIMENT 6

Figure 14:
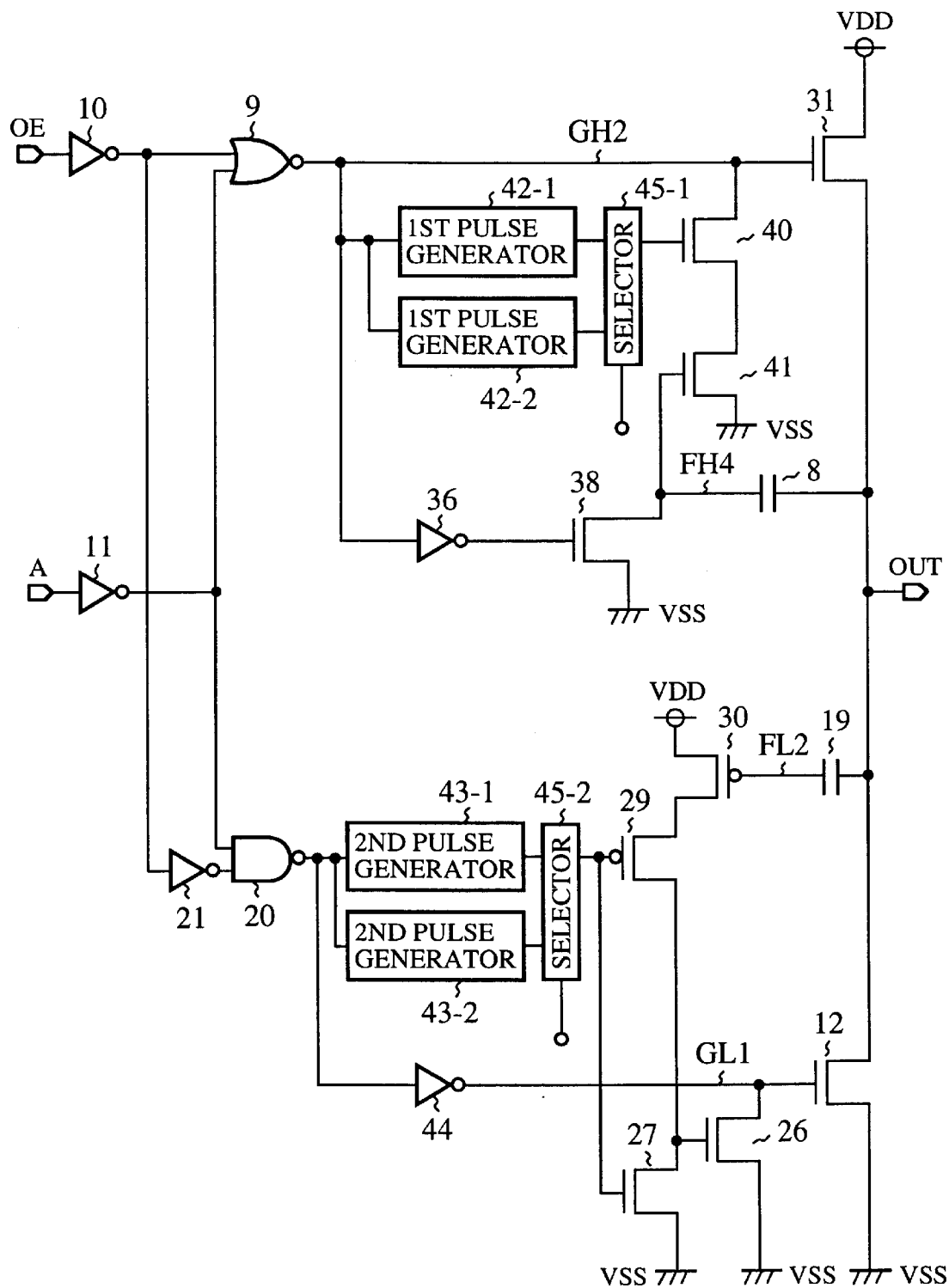
FIG. 14 is a circuit diagram of an output buffer circuit according to a sixth embodiment of the present invention.

FIG. 14 is a circuit diagram illustrating an output buffer circuit according to a sixth embodiment (Embodiment 6) of the present invention. Reference numeral 42-1 denotes a first pulse generator (pulse generating means); 42-2 denotes a third pulse generator (pulse generating means), which outputs high-level pulses over a period of time different from that of the first pulse generator; 43-1 denotes a second pulse generator (pulse generating means); 43-2 denotes a fourth pulse generator (pulse generating means), which outputs low-level pulses over a period of time different from that of the second pulse generator 43-1; 45-1 denotes a selector (a third selector) which selects either one of the first and third pulse generators 42-1 and 42-2 under the control of control means (not shown); 45-2 denotes a selector (a fourth selector) which selects either one of the second and fourth pulse generators 43-1 and 43-2 under the control of control means (not shown). The other constituents are the sane as those of the output buffer circuit according to Embodiment 5 depicted in FIG. 13, and hence they are identified by the same reference numerals.

Next, the operation of this embodiment will be described below.

Under the control of the control means (not shown) the selector 45-1 selects either one of the first and third pulse generators 42-1 and 42-2 which differ in the period of outputting high-level pulses to the N-channel transistor 40. Similarly, under the control of the control means (not shown) the selector 45-2 selects either one of the second and fourth pulse generators 43-1 and 43-2 which differ in the period of outputting low-level pulses to the P-channel transistor 29. With this arrangement, it is possible to change the period of feeding back the potential of the output signal OUT to the N-channel transistor 31 or 12 and hence change the characteristic of the output signal OUT.

The first and third pulse generators 42-1 and 42-2 are identical in operation with the first pulse generator 42 used in Embodiment 5, and the second and fourth pulse generators 43-1 and 43-2 are identical in operation with the second pulse generator 43 in Embodiment 5; hence, no description will be repeated. Incidentally, the configuration of this embodiment is also applicable to the output buffer circuits of Embodiments 1, 2, 3 and 4 depicted in FIGS. 1, 7, 9 and 11, respectively.

As described above, the output buffer circuit according to Embodiment 6 has a construction in which the selectors can each select either one of pulses generators which output pulses of predetermined levels for different periods of time, it is possible to change the period of feeding back the potential of the output signal OUT to the output transistor and hence change the characteristic of the output signal OUT according to particular uses.

EMBODIMENT 7

Figure 15:
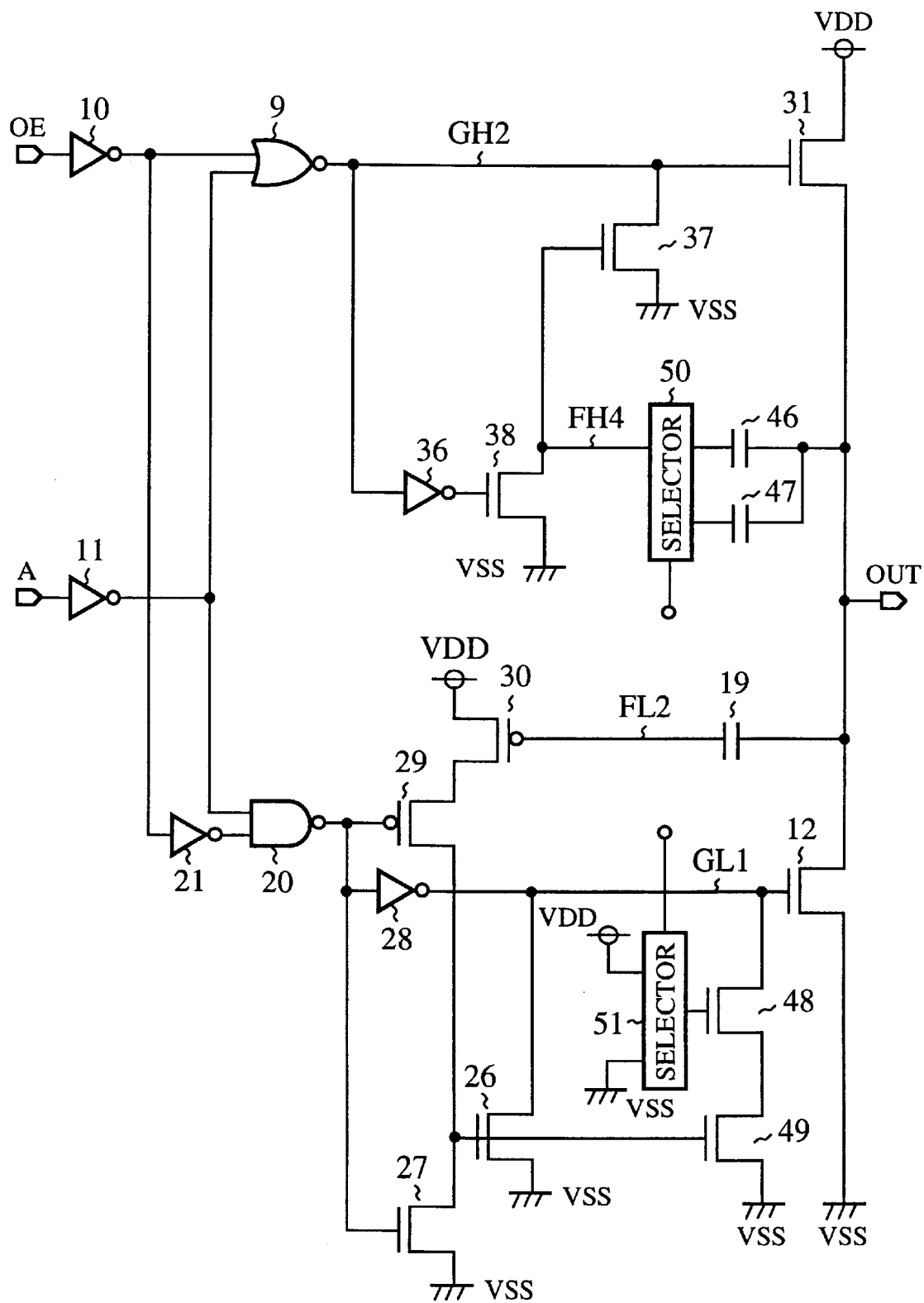
FIG. 15 is a circuit diagram of an output buffer circuit according to a seventh embodiment of the present invention.

FIG. 15 is a circuit diagram illustrating an output buffer circuit according to a seventh embodiment (Embodiment 7) of the present invention. Reference numeral 50 denotes a selector (a first selector) provided in the high-level output side; and 46 and 47 denote capacitances (first and third capacitances) connected in parallel to the output terminal from which the output signal OUT is delivered, the capacitances 46 and 47 being different in capacitance value and provided in the high-level output side. Either one of the capacitances 46 and 47 is selected by the selector 50 that is controlled by a control signal from control means (not shown).

While in the configuration of FIG. 15 the selector 50 and the parallel connection of the capacitances 46 and 47 are disposed in the high-level output side, the present invention is not limited specifically to the illustrated arrangement; for example, the capacitance 19 in the low-level output side may be replaced with the selector 50 and the parallel connection of the capacitances 46 and 47. In this instance, too, either one of the capacitances 46 and 47 is selected by the selector 50.

Reference numerals 48 and 49 denote N-channel transistors (first transistors) provided in the low-level output side, which are connected in series between the gate of the N-channel transistor 12 and the ground. The N-channel transistors 48 and 49 each have the same function as that of the N-channel transistor 26 depicted in FIG. 11. Reference numeral 51 a selector (a second selector), which controls the ON/OFF operation of the N-channel transistor 48 under the control of a control signal from control means (not shown).

While in the configuration of FIG. 15 the selector 51 and the N-channel transistors 48 and 49 are placed in the low-level output side, the present invention is not limited specifically to the illustrated arrangement; for example, the N-channel transistor 37 in the high-level output side may be replaced with the selector 51 and the N-channel transistors 48 and. In this instance, too, the selector 51 controls the ON/OFF operation of the N-channel register 48 under the control of a control signal from control means (not shown). The other constituents are the same as those of the output buffer circuit of Embodiment 4 depicted in FIG. 11, and hence they are identified by the same reference numerals.

Next the operation of this embodiment will be described below.

At the time of providing the high-level output signal OUT from the output terminal, either one of the capacitance 46 and 47, provided in parallel as a substitute for the capacitance 8 in the output buffer circuit of FIG. 1, is selected by the selector 50 under the control of a control signal from control means (not shown). In the case of providing the low-level output signal OUT from the output terminal, the selector 51 controls the ON/OFF operation of the N-channel transistor 48 to change its size.

With the arrangement in which the value of the capacitance for detecting the potential of the output signal OUT and the size of the transistor for actuating the output transistor are variable, the amount of feedback of the potential of the output signal OUT per unit time is variable, making the output characteristic of the output buffer circuit variable. Incidentally, the configuration of this embodiment is also applicable to the output buffer circuits of Embodiments 1 to 6 depicted in FIGS. 1, 7, 9, 11, 13 and 14, respectively. Moreover, the configurations of Embodiments 5 and 7 shown in FIGS. 13 and 15 maybe combined; alternatively, the configurations of Embodiments 6 and 7 depicted in FIGS. 14 and 15 may also be combined.

As described above, according to this embodiment the value of the capacitance for detecting the potential of the output signal OUT is selectable by the selector, and the transistor for controlling the operation of the output transistor is turned ON/OFF by the selector to change the transistor size. Hence, the output characteristic of the output buffer circuit can be changed by controlling the amount of feedback of the potential of the output signal OUT per unit time.

EMBODIMENT 8

Figure 16:
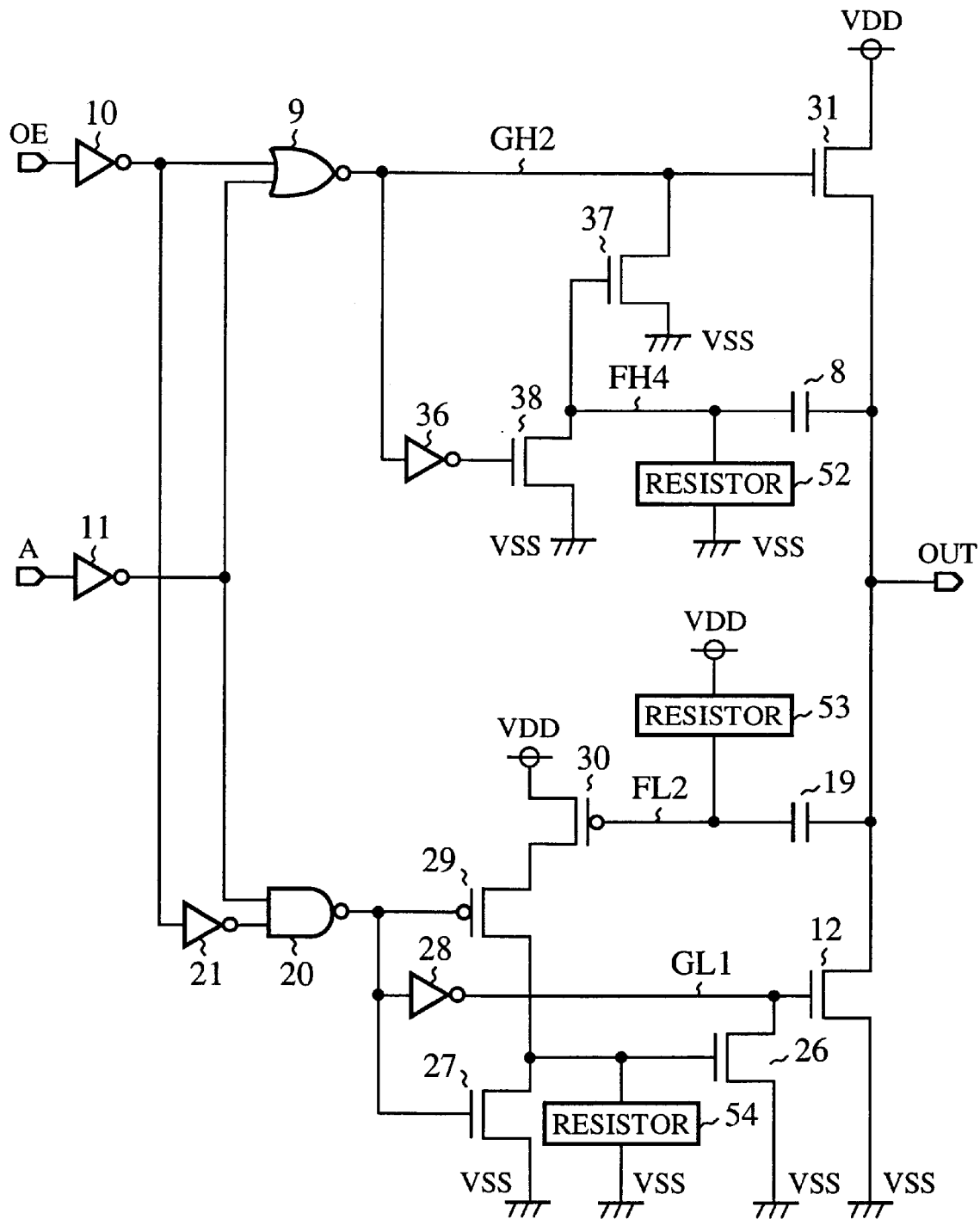
FIG. 16 is a circuit diagram of an output buffer circuit according to an eighth embodiment of the present invention.
Figure 17:
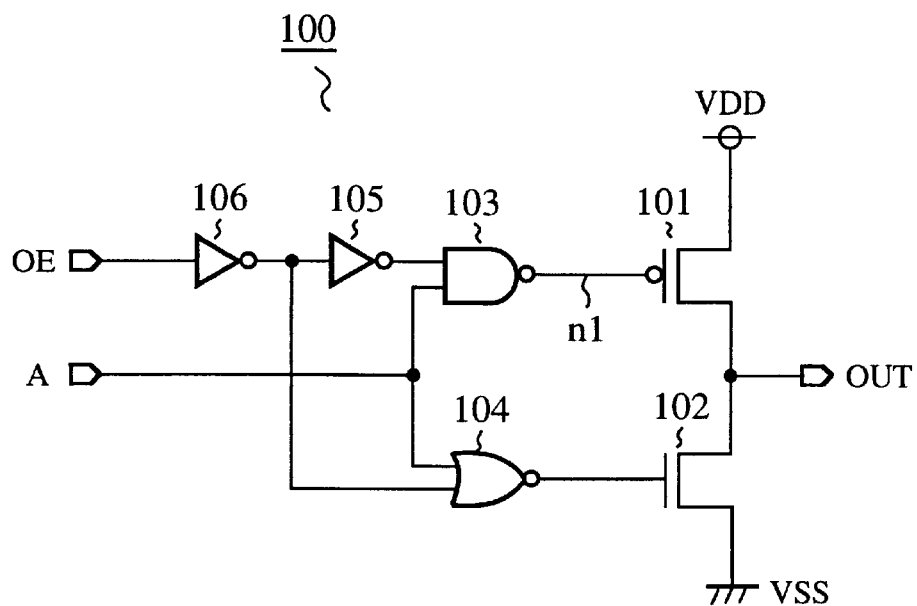
FIG. 17 is a circuit diagram of a conventional output buffer circuit.
Figure 18:
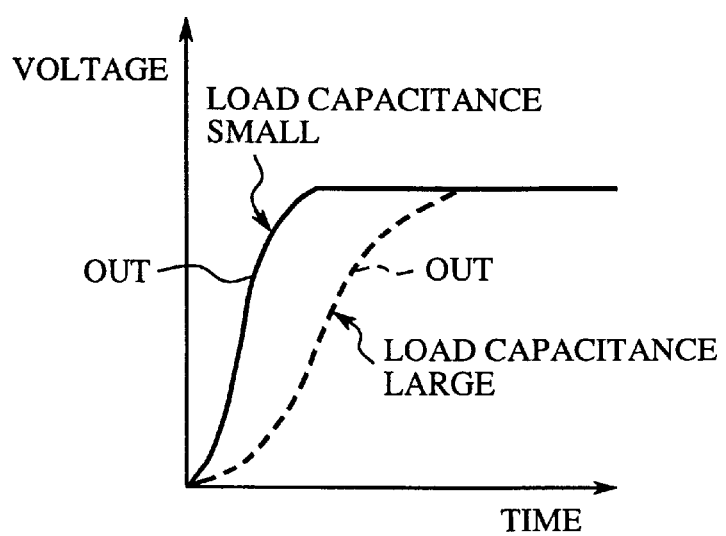
FIG. 18 is a graph explanatory of the operation of the conventional output buffer circuit depicted in FIG. 17.
Figure 19:
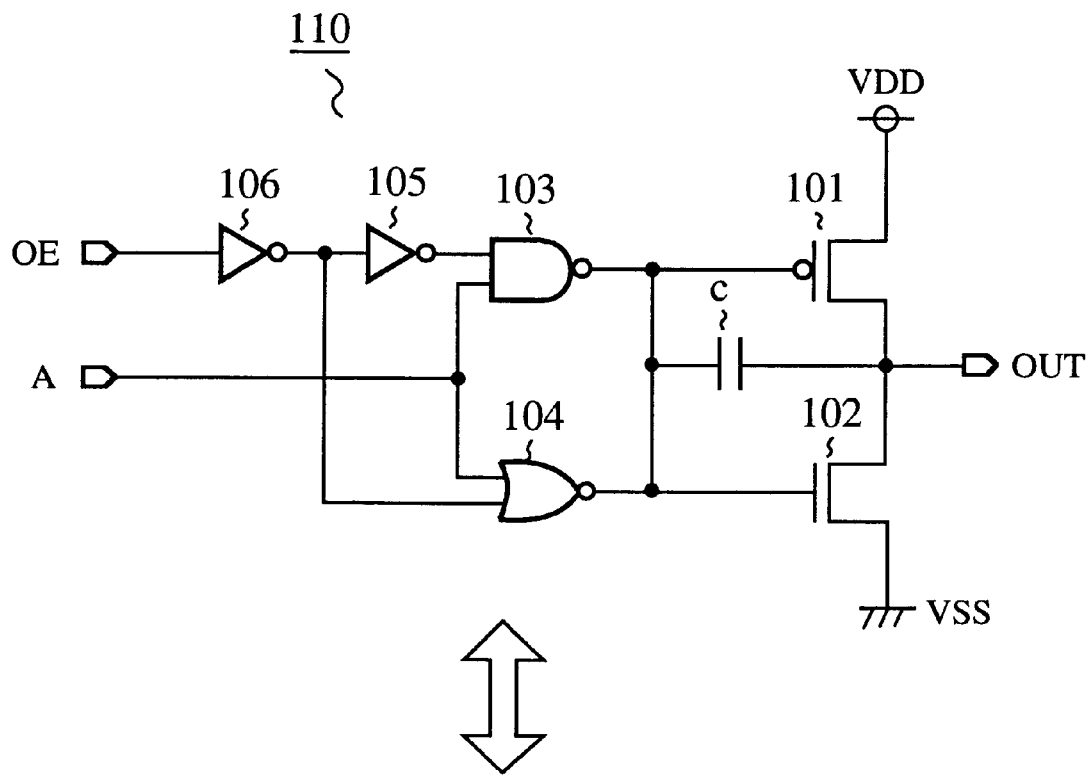
FIG. 19 is a circuit diagram of another conventional output buffer circuit.
Figure 19:
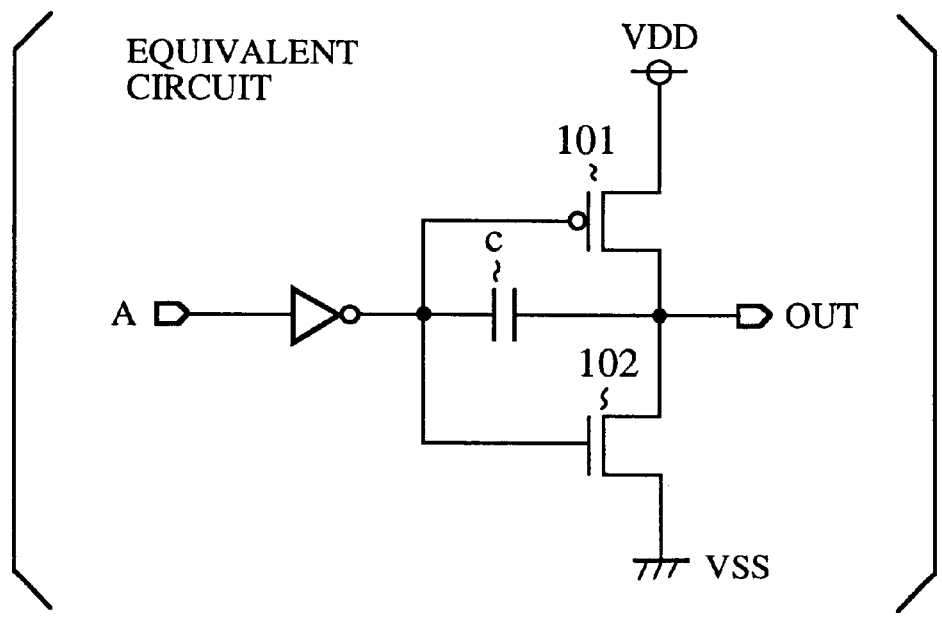
Figure 20:
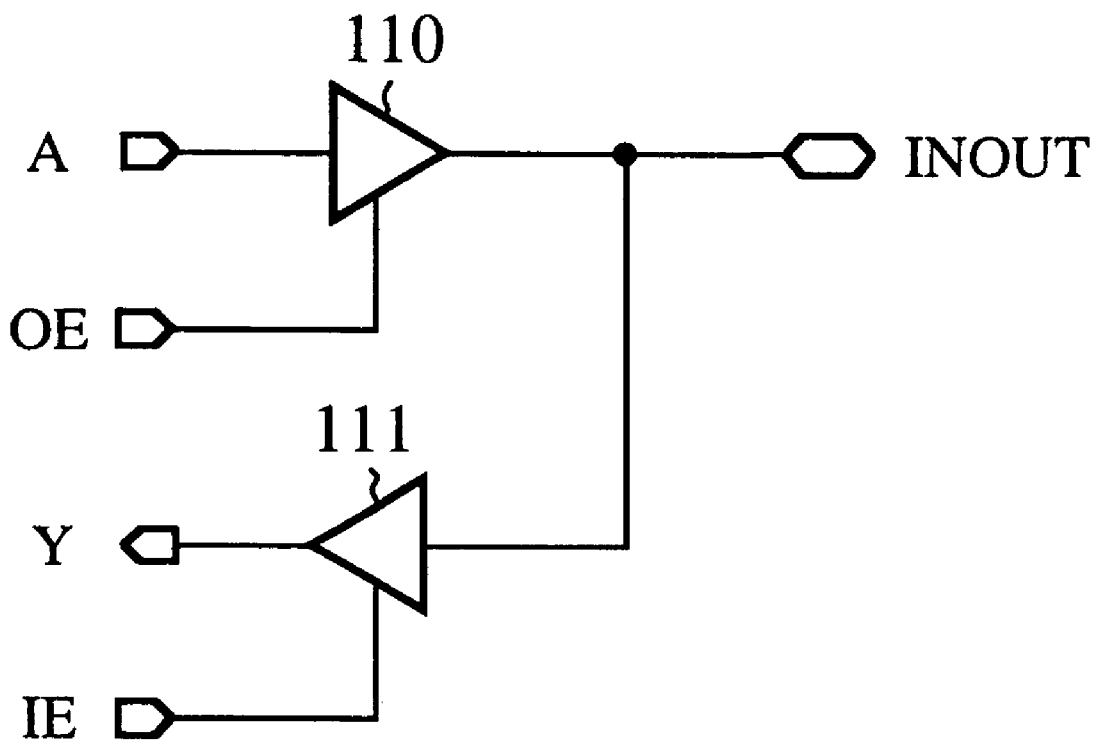
FIG. 20 is a block diagram of an input/output circuit with the output buffer circuit of FIG. 19 built therein.

FIG. 16 is a circuit diagram illustrating an output buffer circuit according to an eighth embodiment (Embodiment 8) of the present invention. Reference numeral 52 denotes a pull-down resistor (a first pull-down resistor) connected to the node FH4 between the capacitance 8 and the gate of the N-channel transistor 37; 53 denotes a pull-up resistor (a first pull-up resistor) connected to the node FL2 between the capacitance 19 and the gate of the P-channel resistor 30; 54 denotes a pull-down resistor (a second pull-down resistor) connected between the gate of the N-channel transistor 26 and the node between the P- and N-channel transistors 29 and 27. The other constituents are the same as those of the output buffer circuit of Embodiment 4 depicted in FIG. 11, and hence they are identified by the same reference numerals.

Next, the operation of this embodiment will be described below.

With the pull-down resistor 52 connected to the node FH4, the pull-up resistor 53 to the node FL2 and the pull-down resistor 54 to the gate of the N-channel transistor 26, the N-channel transistor 37 is in the OFF state, the potential GH2 remains high and the N-channel transistor 31 serving as the output transistor remains ON in the steady state of outputting the high-level output signal OUT—this ensures stable generation of the high-level output signal OUT.

Similarly, in the steady state of outputting the low-level output signal OUT the N-channel transistor 26 is in the OFF state, the potential GL1 is high and the N-channel transistor 12 as the output transistor remains ON, making it possible to stably provide the low-level output signal OUT. This configuration is also applicable to the output buffer circuits of Embodiments 1, 2 and 3 depicted in FIGS. 1, 7 and 9.

As described above, according to this embodiment, the pull-up resistor and the pull-down resistor are provided in association with the line for feeding back the potential of the output signal OUT to the output transistor, and furthermore the pull-down resistor is connected to the gate of the transistor for controlling the operation of the low-level output transistor. Hence, in the output steady state of outputting the output signal OUT the output transistor does not turn OFF, ensuring stable generation of the output signal OUT.

EFFECT OF THE INVENTION

As described above, according to an aspect of the present invention, since the output buffer circuit has the feedback means formed by a transistor so that the capacitance for detecting the potential of the output signal from the output buffer circuit and the detected potential are fed back to the output transistor, the driving power of the output transistor can be controlled in accordance with the load capacitance connected to the output terminal, and even if the value of the load capacitance varies, the time for the output signal to reach a predetermined level can be held constant. When no output signal is provided from the output terminal, the feedback means for feeding back the potential of the output signal to the output transistor is turned OFF—this precludes the possibility of malfunctioning of the output buffer circuit when it is built in an input/output circuit.

According to another aspect of the present invention, since the output buffer circuit has a construction in which the pulse generator, which outputs pulses of a predetermined potential for a predetermined time, is provided in the line for feeding back the potential of the output signal to the output transistor, the period of feeding back of the potential of the output signal to the output transistor can be changed. Hence, by the feedback of the potential of the output signal, it is possible to control the driving power of the output transistor and stably output the output signal of the predetermined level even after the output steady state is reached.

According to another aspect of the present invention, since the output buffer circuit has a construction in which either one of pulse generators, which generate pulses of different predetermined levels for different periods of times, is selected by the selector, the period for feeding back the potential of the output signal to the output transistor can be changed, and hence the characteristic of the output signal can be changed according to a particular use.

According to another aspect of the present invention, the output buffer circuit has a construction in which the value of the capacitance for detecting the potential of the output signal can be selected by the selector and the transistor for controlling the operation of the output transistor is tuned ON/OFF by the selector to change the transistor size, it is possible to change the output characteristic of the output buffer circuit by controlling the amount of feedback of the potential of the output signal per unit time.

According to still another aspect of the present invention, since the output buffer circuit has a construction in which a pull-up resistor and a pull-down resistor are associated with the line for feeding back the potential of the output signal OUT to the output transistor and a pull-down resistor is associated with the gate of the transistor for controlling the low-level output transistor, the output transistor does not turn OFF in the output steady state and hence the output signal OUT of the predetermined level can be obtained with stability.

It will be apparent that many modifications and variations may be effected without departing from the scope of the novel concepts of the present invention.

What is claimed is:

1. An output buffer circuit comprising:

an output transistor which supplies a voltage to an output signal to be output from an output terminal in accordance with the level of an input signal fed via an input terminal;

a capacitance for detecting the potential of said output signal;

feedback control means formed by a transistor and connected between said capacitance and said output transistor, for feeding back the potential of said output signal detected by said capacitance to control the gate potential of said output transistor and control the driving power of said output transistor so that said output signal reaches a predetermined level in a fixed time regardless of a change in the capacitance of a load connected to said output terminal; and a control transistor for turning OFF said the operation of said feedback control means when said output signal is not output.

2. The output buffer circuit of claim 1, wherein said output transistor is a P-channel transistor for supplying a high-level voltage to said output signal when it is high-level and said output transistor is an N-channel transistor for supplying a low-level voltage to said output signal when it is low-level.

3. The output buffer circuit of claim 1, wherein said output transistor is an N-channel transistor for supplying a high-level to said output signal when it is high-level and said output transistor is a N-channel transistor for supplying a low-level voltage to said output signal when it is low-level.

4. The output buffer circuit of claim 1, wherein said capacitance comprises a first capacitance for detecting the voltage of said output signal when it is high-level and a second capacitance for detecting the level of said output signal when it is low-level.

5. The output buffer circuit of claim 4, further comprising: a third capacitance connected in parallel to said first or second capacitance and having a capacitance value different from that of said first or second capacitance; and a first selector for selecting any one of said first, second and third capacitances.

6. The output buffer circuit of claim 4, wherein said feedback control means further comprises:

a plurality of transistors connected in series between the gate of said output transistor for generating a high- or low-level output signal and the ground, for feeding back the potential of said output signal detected by said first or second capacitance to said output transistor; and a second selector for selecting either one of said plurality of transistors to change the size of said transistor.

7. The output buffer circuit of claim 4, further comprising:

a first pull-down resistor connected to said first capacitance;

a first pull-up resistor connected to said second capacitance; and a second pull-down resistor connected between said second capacitance and the gate of the output transistor for generating said low-level output signal.

8. The output buffer circuit of claim 1, further comprising pulse generating means responsive to said input signal to output pulses of a predetermined level to said feedback control means for a predetermined period of time, thereby controlling the time for which the potential of said output signal detected by said capacitance is fed back to the gate of said output transistor.

9. The output buffer circuit of claim 8, wherein said pulse generating means comprises:

a first pulse generator which, at the time of generating a high-level output signal, applies high-level pulses to said feedback control means for a predetermined period of time, thereby controlling the driving power of an output transistor for generating said high-level output signal; and a second pulse generator which, at the time of generating a low-level output signal, applies low-level pulses to said feedback control means for a predetermined period of time, thereby controlling the driving power of an output transistor for generating said low-level output signal.

10. The output buffer circuit of claim 9, wherein said pulse generating means flier comprises:

a third pulse generator connected in parallel to said first pulse generator, for applying high-level pulses to said feedback control means for a period of time different from that for which said first pulse generator applies said high-level pulses to said feedback control means;

a fourth pulse generator connected in parallel to said second pulse generator, for applying low-level pulses to said feedback control means for a period of time different from that for which said second pulse generator applies said low-level pulses to said feedback control means;

a third selector for selecting either one of said first and third pulse generators; and a fourth selector for selecting either one of said second and fourth pulse generators.

\* \* \* \* \*